United States Patent
Yamada

(10) Patent No.: US 8,169,127 B2
(45) Date of Patent: May 1, 2012

(54) FLEXURAL VIBRATION ELEMENT AND ELECTRONIC COMPONENT

(75) Inventor: Akinori Yamada, Ina (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/281,024

(22) Filed: Oct. 25, 2011

(65) Prior Publication Data

US 2012/0038251 A1 Feb. 16, 2012

Related U.S. Application Data

(62) Division of application No. 12/638,641, filed on Dec. 15, 2009, now Pat. No. 8,067,880.

(30) Foreign Application Priority Data

Dec. 27, 2008 (JP) ................................. 2008-335548

(51) Int. Cl.
*H01L 41/08* (2006.01)
(52) U.S. Cl. ...................................................... 310/370
(58) Field of Classification Search .................. 310/370, 310/344, 357, 365, 366, 348, 351, 328; 73/504.02–504.16; *H01L 41/08, 41/09; H03H 9/21, 9/19, 9/215*
See application file for complete search history.

(56) References Cited

U.S. PATENT DOCUMENTS

| | | | |
|---|---|---|---|
| 6,587,009 B2 | 7/2003 | Kitamura et al. | |
| 6,700,313 B2 * | 3/2004 | Dalla Piazza et al. | 310/370 |
| 7,084,556 B1 | 8/2006 | Piazza et al. | |
| 7,528,682 B2 * | 5/2009 | Kawashima | 333/187 |
| 2005/0040737 A1 * | 2/2005 | Tanaya | 310/370 |
| 2005/0062368 A1 * | 3/2005 | Hirasawa et al. | 310/370 |

FOREIGN PATENT DOCUMENTS

| | | |
|---|---|---|
| JP | B-43-1194 | 1/1968 |
| JP | A-1-282751 | 11/1989 |
| JP | U-2-32229 | 2/1990 |
| JP | A-5-312576 | 11/1993 |
| JP | A-10-19577 | 1/1998 |
| JP | A-2001-183140 | 7/2001 |
| JP | A-2002-261575 | 9/2002 |

(Continued)

OTHER PUBLICATIONS

Itoh et al., "Analysis of Q-value of a quartz-crystal tuning-fork using Thermoelastic equations," 36th EM Symposium, pp. 5-8, May 17, 2007.

(Continued)

*Primary Examiner* — Thomas Dougherty
*Assistant Examiner* — Karen B Addison
(74) *Attorney, Agent, or Firm* — Oliff & Berridge, PLC

(57) ABSTRACT

A flexural vibration element includes: a plurality of vibrating arms provided in parallel with each other; a connecting part connecting the vibrating arms; and one central supporting arm extending between the vibrating arms from the connecting part in parallel with the vibrating arms at equal distance from the arms. In the flexural vibration element, the connecting part has a groove formed on each of front and rear surfaces thereof, and the groove is provided in an area of the connecting part in which compressive stress and tensile stress due to flexural vibration of the vibrating arms alternately occur at a vibrating arm side and an opposite side of the vibrating arm side, in a width direction of the vibrating arms.

8 Claims, 5 Drawing Sheets

FOREIGN PATENT DOCUMENTS

| | | |
|---|---|---|
| JP | A-2004-260718 | 9/2004 |
| JP | A-2006-345519 | 12/2006 |

OTHER PUBLICATIONS

Itoii et al., "Analysis of Q-Value of Quartz Crystal Tuning Fork Using Thermoelastic Coupling Equations," Japanese Journal of Applied Physics, vol. 48, pp. 07GF03-1 to 07GF03-5, The Japanese Society of Applied Physics, 2009.

Zener et al., "Internal Friction in Solids: I. Theory of Internal Friction in Reeds," Physical Preview, vol. 52, pp. 230-235, Aug. 1, 1937.

Zener et al., " Internal Friction in Solids: II. General Theory of Thermoelastic Internal Friction," Physical Review, vol. 53, pp. 90-99, Jan. 1, 1938.

Zener et al., "Internal Friction of Solids: III. Experimental Demonstration of Thermoelastic Internal Friction," Physical Preview, vol. 53, pp. 100-101, Jan. 1, 1938.

Roszhart et al., "The effect of thermoelastic internal friction on the Q of micromachined silicon resonators," Solid-State Sensor and Actuator Workshop, Technical Digest IEEE, pp. 13-16, Jan. 4, 1990.

* cited by examiner

US 8,169,127 B2

FLEXURAL VIBRATION ELEMENT AND ELECTRONIC COMPONENT

This is a Division of application Ser. No. 12/638,641 filed Dec. 15, 2009. The disclosure of the prior application is hereby incorporated by reference herein in its entirety.

BACKGROUND

1. Technical Field

The present invention relates to a flexural vibration element which vibrates in a flexural vibration mode, and various electronic components including the flexural vibration element, such as a vibrator, a resonator, an oscillator gyro, and various sensors.

2. Related Art

As a piezoelectric vibration element in a flexural vibration mode, such a tuning fork type piezoelectric vibration element has been widely used that a pair of vibrating arms is extended in parallel from a base part and the vibrating arms vibrate closer to or away from each other in a horizontal direction. Vibration energy loss generated when the vibrating arms perform flexural vibration causes degradation of performance of a vibrator such as increase of a CI value and decrease of a Q value. Therefore, various ways for preventing or reducing the vibration energy loss has been contrived.

JP-A-2002-261575 as a first example and JP-A-2004-260718 as a second example disclose a tuning fork type quartz crystal vibration element in which cuts or cut-grooves having a predetermined depth are formed at both side parts of a base part from which vibrating arms extend. In the quartz crystal vibration element, even in a case where the vibrating arms generate vibration including a vertical component, vibration leak from the base part is suppressed by the cuts or the cut-grooves so as to improve a vibration energy trapping effect and prevent variation of CI values among vibration elements.

Not only such the mechanical loss but also vibration energy loss is generated by heat conduction due to temperature difference between a compressive part and a tensile part, which receives tensile stress, of the vibrating arms which perform flexural vibration. Decrease of the Q value caused by the heat conduction is called a thermoelastic loss. In order to prevent or suppress the decrease of the Q value due to the thermaleastic loss, Japanese Patent Application No. 63-110151 as a third example proposes a tuning fork type vibrator, in which a groove or a hole is formed on a centerline of a vibrating arm (vibrating beam) having a rectangular section.

The third example describes that the Q value becomes minimum when a relaxation frequency fm is expressed as $fm = 1/2\pi\tau$ (here, $\pi$ denotes circle ratio, and $\tau$ denotes relaxation time) in a vibrator in a flexural vibration mode. This is based on a relational equation, which is well known, of distortion and stress in a case of internal friction, which is generally caused by temperature difference, of a solid substance. A relationship between a Q value and a frequency is generally expressed as a curve F of FIG. 5 (refer to, for example, C. Zener et al., "Internal Friction in Solids III. Experimental Demonstration of Thermoelastic Internal Friction", Physical Review, Volume 53, pp. 100-101 (January 1938)). Referring to FIG. 5, the Q value becomes a minimum value Q0 at a relaxation frequency f0 ($=1/2\pi\tau$).

Here, it is also known that the relaxation frequency f0 can be obtained from the following formula.

$$f0 = \pi k/(2 p C_p a^2) \quad (1)$$

Here, $\pi$ denotes circle ratio, k denotes a thermal capacity of a vibration part (flexural vibration part), and a denotes a width of the vibration part (flexural vibration part) in a vibrating direction (flexural vibrating direction).

On the other hand, as a flexural vibrator other than that of a tuning fork type, JP-A-2006-345519 as a fourth example discloses a resonator in which two parallel vibrating arms are coupled to each other by a connecting part and a central arm is extended between the vibrating arms from the connecting part. The resonator is composed of a single-component vibration element made of quartz crystal. In the resonator, at least one groove is formed on at least one of a front surface and a rear surface of the vibrating arms so as to make an excitation electric field even and regionally-strong, reducing energy consumption and limiting a CI value. Further, the groove of the vibrating arms is extended to the connecting part, at which mechanical stress is maximum, to extract an electric field in this region, increasing a vibration coupling effect of the vibrating arms.

Vibration elements vibrating in the flexural vibration mode include a vibration element of an electrostatic driving type using electrostatic force and a vibration element of a magnetic driving type using magnetism as well as the vibration element of the piezoelectric driving type described above. JP-A-5-312576 as a fifth example discloses an angular velocity sensor as a vibration element of the electrostatic driving type. In the angular velocity sensor, a first vibrating body composed of a square frame part is supported by a first supporting beam so as to be able to vibrate in X-axis direction, and a second vibrating body having a square plain plate shape is supported by a second supporting beam so as to be able to vibrate in Y-axis direction, on a substrate made of a silicon material. The first supporting beam bends due to electrostatic force which is generated between a fixed conductive part provided on an end part of the substrate and a movable conductive part provided on an end part of the first vibrating body. Thus the first vibrating body vibrates in the X-axis direction. JP-A-2001-183140 as a sixth example discloses another angular velocity sensor as another vibration element of the electrostatic driving type. This angular velocity sensor is composed of a sensor body made of a silicon wafer and a glass substrate opposed to the sensor body. The sensor body has plummets held in an inside of a vibration frame, which is supported in a fixed frame by a driving beam, by multiple beams. The sensor body and the plummets vibrate due to electrostatic force generated between parallel plain plate electrodes provided on the sensor body and the glass substrate.

Further, JP-B-43-1194 as a seventh example discloses a vibrating body structure as a vibration element of the magnetic driving type. In the vibrating body structure, a vibrating body made of a constant modulus material is fixed and supported on an external fixing pedestal at its supporting part at one end thereof. A spring part branched from a connecting part between the vibrating body and the pedestal is driven and vibrated by magnet fixed to a free end of the spring part and by an electromagnetic coil fixed to a base. JP-A-10-19577 as an eighth example discloses an angular velocity sensor as another vibration element of the magnetic driving type. In the angular velocity sensor, a thin film magnet is disposed on a thin film vibrating plate which is composed of a silicon substrate and is supported as a cantilever beam. The thin film vibrating plate is vibrated in a thickness direction by an effect of electromagnetic force generated by applying alternating current to a conductor or an electromagnetic coil provided outside the thin film vibrating plate.

However, as far as the inventor knows, almost only the third example studies an influence of the above-mentioned thermoelastic loss given to the piezoelectric vibration element in a flexural vibration mode, among related arts. The inventor studied an influence of thermoelastic loss, caused by flexural vibration of vibrating arms, on performances of the vibrating arms in a piezoelectric vibration element having such a structure that one central supporting arm was extended between the two vibrating arms from a connecting part as illustrated in the fourth example.

Referring to FIG. 6, this piezoelectric vibration element 1 includes two vibrating arms 3 and 4 extending from a connecting part 2 in parallel. Between the vibrating arms 3 and 4, one central supporting arm 5 extends in parallel with the arms 3 and 4 at equal distance from the arms 3 and 4. A linear groove 6 is formed on each of a front surface and a rear surface of the vibrating arm 3 and a linear groove 7 is formed on each of a front surface and a rear surface of the vibrating arm 4. The piezoelectric vibration element 1 is fixed and held on a package or the like, which is not shown, at an end of the central supporting arm 5, that is, at an end part opposite to the connecting part 2. When predetermined voltage is applied to an excitation electrode, which is not shown, in this state, the vibrating arms 3 and 4 perform flexural vibration in a direction closer to or away from each other as shown by imaginary lines and arrows in the drawing.

Because of this flexural vibration, mechanical distortion occurred in the connecting part 2 along a width direction of the vibrating arms 3 and 4, concretely, at a region 8 between a connecting portion of the connecting part 2 with the vibrating arm 3 and a connecting portion of the same with the central supporting arm 5, and at a region 9 between a connecting portion of the connecting part 2 with the vibrating arm 4 and the connecting portion of the same with the central supporting arm 5. This distortion was observed as relatively large temperature gradients between a part 10 at a vibrating arm side of the region 8 and a part 12 opposed to the part 10 and between a part 11 at the vibrating arm side of the region 9 and a part 13 opposed to the 11. When the vibrating arms 3 and 4 bent closer to each other, compressive stress acted on the parts 10 and 11 at the vibrating arm side respectively in the regions 8 and 9 so as to increase the temperatures of the parts 10 and 11, and tensile stress acted on the parts 12 and 13, which were respectively opposed to the parts 10 and 11, so as to decrease the temperatures of the parts 12 and 13. In an opposite manner, when the vibrating arms 3 and 4 bent away from each other, tensile stress acted on the parts 10 and 11 at the vibrating arm side respectively in the regions 8 and 9 so as to decrease the temperatures of the parts 10 and 11, and compressive stress acted on the parts 12 and 13, which were respectively opposed to the parts 10 and 11, so as to increase the temperatures of the parts 12 and 13.

Because of the temperature gradients, heat conduction occurs in the connecting part 2 between the part 10 at the vibrating arm side of the region 8 and the part 12 opposed to the part 10, and between the part 11 at the vibrating arm side of the region 9 and the part 13 opposed to the part 11. The temperature gradients in opposite directions to each other occur respectively at the vibrating arm side and at the opposite side of the vibrating arm side while corresponding to the flexural vibration of the vibrating arms, generating heat conductions in opposite directions to each other. Because of the heat conductions, part of vibration energy of the vibrating arms 3 and 4 is constantly lost during their vibration as the thermoelastic loss. As a result, a Q value of the vibration element is degraded, making hard to achieve desired high-performance of the vibration element.

SUMMARY

An advantage of the present invention is to provide such a flexural vibration element in a flexural vibration mode that mechanical loss and/or thermoelastic loss of vibration energy of a plurality of vibrating arms are/is suppressed and performance thereof is improved. In the flexural vibration element, one central supporting arm extends from a connecting part between the vibrating arms.

A flexural vibration element according to a first aspect of the invention includes: a plurality of vibrating arms provided in parallel with each other; a connecting part connecting the vibrating arms; and one central supporting arm extending between the vibrating arms from the connecting part in parallel with the arms at equal distance from the arms. In the flexural vibration element, the connecting part has a groove formed on each of front and rear surfaces thereof in a width direction of the vibrating arms, and the groove is provided in an area of the connecting part in which compressive stress and tensile stress due to flexural vibration of the vibrating arms alternately occur at a vibrating arm side and an opposite side of the vibrating arm side.

Compressive stress and tensile stress alternately occur due to the flexural vibration of the vibrating arms between the vibrating arm side and the opposite side of the vibrating arm side in the connecting part. Accordingly, temperature-increase due to the compression and temperature-decrease due to the extension are generated at the vibrating arm side and the opposite side, generating temperature difference between the sides. However, heat conduction between the vibrating arm side and the opposite side is prevented by the groove of the connecting part. Accordingly, decrease of a Q value due to thermoelastic loss is suppressed, being able to achieve higher performance of the flexural vibration element.

The flexural vibration element of the invention may be a piezoelectric vibration element of a piezoelectric driving type which is used in a piezoelectric device such as a vibrator, a resonator, a gyro, and various sensors, and other electronic components. Further, the flexural vibration element of the invention may be a flexural vibration element of an electrostatic driving type and that of a magnetic driving type.

It is preferable that the groove be formed between a connecting portion of the connecting part with each of the vibrating arms and a connecting portion of the connecting part with the central supporting arm, in the width direction of the vibrating arms. As a result of the study of the inventor, it was found that when the groove of the connecting part was formed on an extended line of the vibrating arms or that of the central supporting arm, the groove inversely affected the flexural vibration of the vibrating arms so as to generate vibration energy loss and degrade the Q value.

In the flexural vibration element of the aspect, the groove of the connecting part may have a bottom. Accordingly, a heat transfer path between the vibration arm side of the connecting part and the opposite side of the vibration arm side is narrowed at an intermediate part thereof, which is equivalent to elongating the heat transfer path. As a result, a relaxation time τ during which the temperature becomes an equilibrium condition between the vibrating arm side of the connecting part and the opposite side is elongated. Therefore, relaxation frequency ($f=1/2\pi\tau$) in a minimum Q value is lower than that in a case without any groove. Accordingly, in a frequency range in which the relaxation vibration frequency is higher than that of the case without any groove, the Q value is higher than a related art.

In the flexural vibration element of the aspect, the groove of the connecting part may be a through groove. Accordingly, the heat transfer path between the vibrating arm side of the connecting part and the opposite side of the vibrating arm side is cut at an intermediate part thereof so as to be shorter than that of a related art structure. As a result, a relaxation time t during which the temperature becomes an equilibrium condition between the vibrating arm side of the connecting part and the opposite side is shortened. Therefore, relaxation frequency ($f=1/2\pi\tau$) in a minimum Q value is higher than that of a case without any groove. Accordingly, in a frequency range in which the relaxation vibration frequency is lower than that of a case without any groove, the Q value is higher than a related art.

In the flexural vibration element of the first aspect, it is preferable that a width W of the groove, in a longitudinal direction of the vibrating arms, with respect to a width T of the connecting part be in a range of $0.1\ T \leq W \leq 0.65\ T$. Accordingly, the Q value can be increased about 5% or more compared to a related art. Further, in the flexural vibration element of the first aspect, it is preferable that the width W of the groove, in the longitudinal direction of the vibrating arms, with respect to the width T of the connecting part be in a range of $0.2\ T \leq W \leq 0.6\ T$. Accordingly, the Q value can be more preferably increased.

The flexural vibration element of the first aspect may be made of a quartz crystal material as is the case with a related art tuning-fork type piezoelectric vibration element, or may be made of other known piezoelectric material.

An electronic component according to a second aspect of the invention includes the flexural vibration element of the first aspect. Accordingly, a piezoelectric device such as a piezoelectric vibrator, a resonator, a piezoelectric oscillator, and an angular velocity sensor, and other electronic components that have a high Q value and exhibit high-performance can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention will now be described with reference to the accompanying drawings.

First Embodiment

Figure 1:
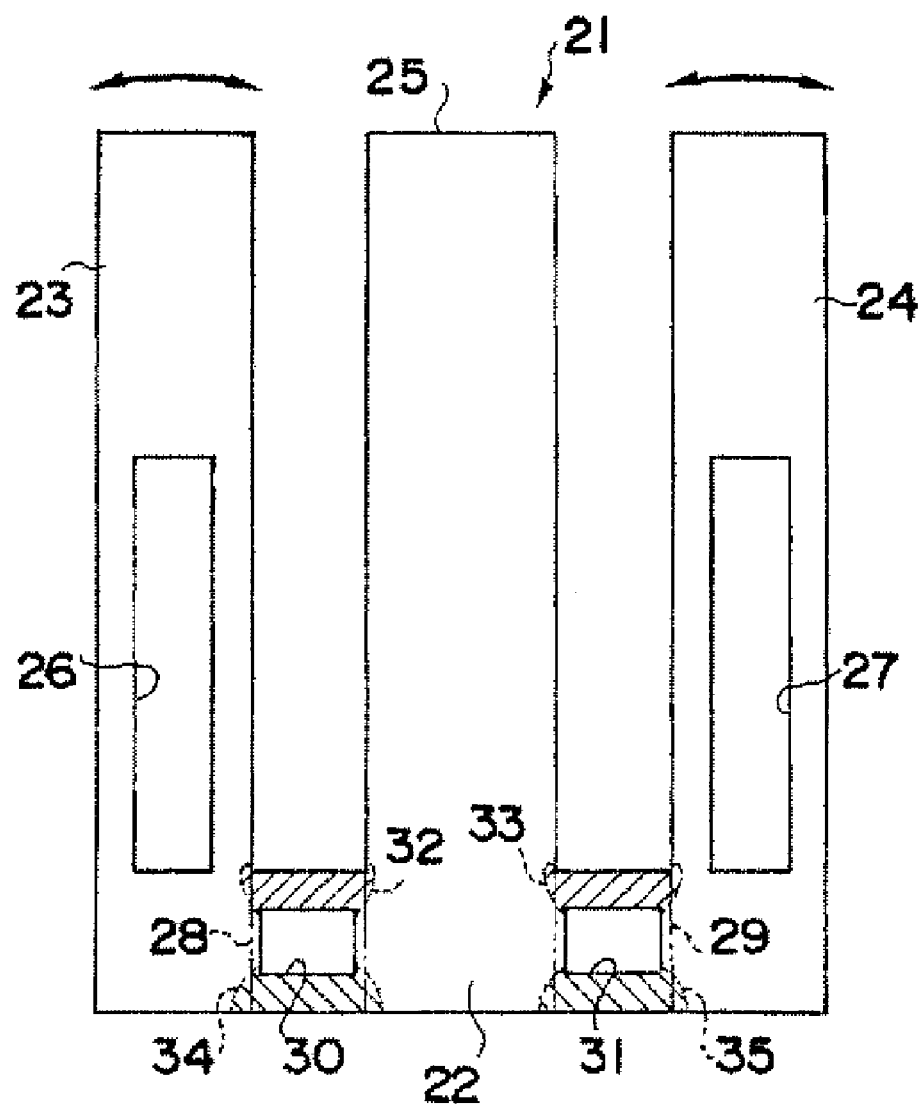
FIG. 1 is a plan view showing a piezoelectric vibration element according to a first embodiment of the invention.

FIG. 1 is a schematic view showing a structure of a piezoelectric vibration element, according to a first embodiment, to which the present invention is applied. A piezoelectric vibration element 21 according to the first embodiment includes a connecting part 22, two vibrating arms 23 and 24 which extend in parallel from the connecting part 22, and one central supporting arm 25. The central supporting arm 25 extends from the connecting part 22 between the vibrating arms 23 and 24 in parallel with the arms 23 and 24 at equal distance from the arms 23 and 24. A groove 26 having a linear shape is formed on each of a front surface and a rear surface of the vibrating arm 23 and a groove 27 having a linear shape is formed on each of a front surface and a rear surface of the vibrating arm 24, so as to control a crystal impedance (CI) value.

Figure 2A:
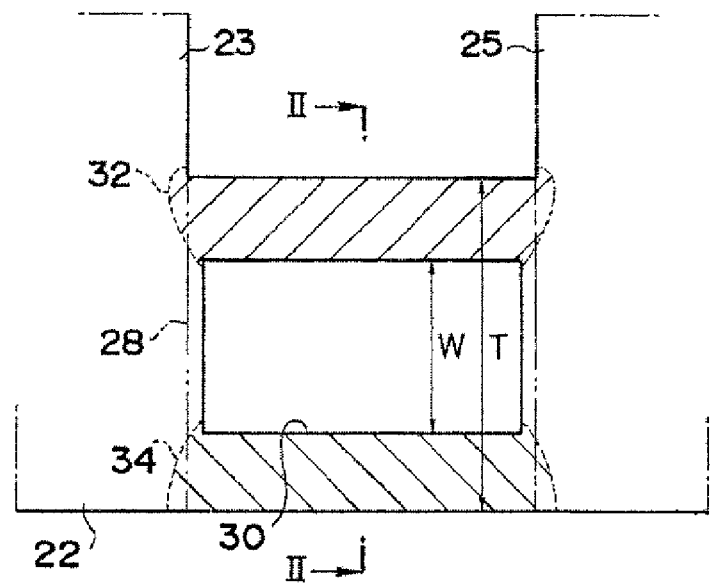
FIG. 2A is a partially-enlarged plan view showing a connecting part of the piezoelectric vibration element of FIG. 1.
Figure 2B:
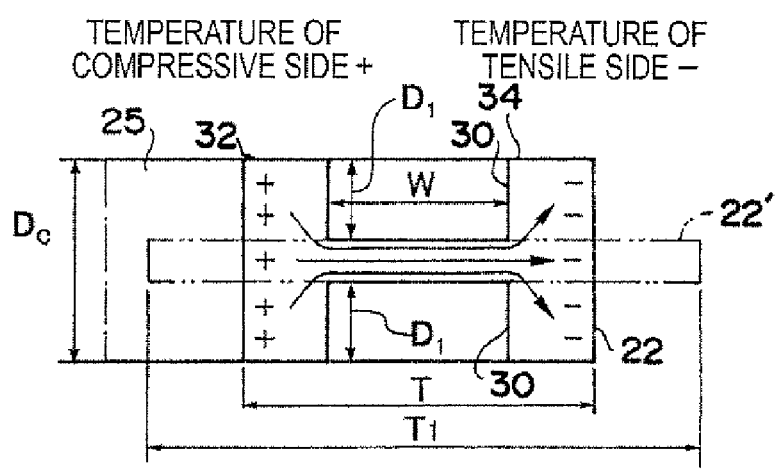
FIG. 2B is a sectional view taken along a II-II line of FIG. 2A.

As shown in FIGS. 1 and 2A, grooves 30 and 31 are formed on both of front and rear surfaces of the connecting part 22 along a direction orthogonal to a longitudinal direction of the vibrating arms. The groove 30 is formed in a region 28 which is between a connecting portion of the connecting part 22 with the vibrating arm 23 and a connecting portion of the same with the central supporting arm 25. The groove 31 is formed in a region 29 which is between a connecting portion of the connecting part 22 with the vibrating arm 24 and a connecting portion of the same with the central supporting arm 25. The grooves 30 and 31 respectively have bottoms. The grooves 30 have the same depths as each other from the front and rear surfaces of the part 22, and the grooves 31 have the same depth as each other as well from the front and rear surfaces of the part 22, as illustrated in FIG. 2B. The grooves 30 and 31 are formed at equal distance from an edge of the part 22 at a vibrating arm side and from an edge at an opposite side along a longitudinal direction of the vibrating arms.

The piezoelectric vibration element 21 is composed of a so-called Z-cut quartz crystal thin plate in which Y-axis of a quartz crystal axis is oriented in a longitudinal direction of the vibrating arms, X-axis is oriented in a width direction of the arms, and Z-axis is oriented in an orthogonal direction of the front surface and the rear surface of the vibration element, like a related art tuning-fork type quartz crystal vibration element. The piezoelectric vibration element 21 may be made of a piezoelectric material other than quartz crystal.

Though they are not shown, an excitation electrode is formed on surfaces, including inner surfaces of the grooves 26 and 27, of the vibrating arms 23 and 24, and a wiring extracted from the excitation electrode and a connecting terminal are formed on surfaces of the connecting part 22 and the central supporting arm 25. In a use of the piezoelectric vibration element 21, the element 21 is fixed to a package or the like, which is not shown, at an end of the central supporting arm 25, that is, at an end part opposite to the connecting part 22 so as to be held nearly-horizontally as a cantilever. When predetermined voltage is applied to the excitation electrode in this state, the vibrating arms 23 and 24 horizontally perform flexural vibration in a direction closer to or away from each other as shown by arrows in the drawing.

Because of this flexural vibration, compressive stress and tensile stress are generated in the connecting part 22 along the width direction of the vibrating arms 23 and 24, concretely, at the region 28 between the connecting portion of the connecting part 22 with the vibrating arm 23 and the connecting portion of the same with the central supporting arm 25, and at the region 29 between the connecting portion of the connecting part 22 with the vibrating arm 24 and the connecting portion of the same with the central supporting arm 25. Namely, when the vibrating arms 23 and 24 bend closer to each other, compressive stress acts on a part 32 at the vibrating arm side of the region 28 and a part 33 at the vibrating arm side of the region 29, and tensile stress acts on a part 34 opposed to the part 32 and a part 35 opposed to the part 33. Because of this mechanical distortion, temperatures of the parts 32 and 33 which receive compressive stress are increased, and temperatures of the parts 34 and 35 which receive tensile stress are decreased. In an opposite manner, when the vibrating arms 23 and 24 bend away from each other, tensile stress acts on the parts 32 and 33 at the vibrating arm side so as to decrease the temperatures of the parts 32 and 33, and compressive stress acts on the parts 34 and 35 at the opposite side so as to increase the temperatures of the parts 34 and 35. As this, in the connecting part 22, temperature gradient is generated between the part 32 at the vibrating arm side and the part 34 at the opposite side of the part 32 and between the part 33 at the vibrating arm side and the part 35 at the opposite side of the part 33. The direction of the gradient inverts depending on the bending direction of the vibrating arms 23 and 24, that is, the direction coming closer to each other or away from each other.

FIG. 2B illustrates a case where the part 32 (33) at the vibrating arm side becomes a compressive side and the part 34 (35) at the opposite side of the part 32 (33) becomes a tensile side when the vibrating arms bend in a direction coming closer to each other. In the drawing, + denotes temperature-increase, and – denotes temperature-decrease. The temperature increases at the part 32 at the compressive side, and the temperature decreases at the part 34 at the tensile side. Because of this temperature gradient, heat transfers from the part 32 at the compressive side (+) through a part at the groove 30 to the part 34 at the tensile side (–).

In an opposite manner, when the vibrating arms bend away from each other, the part 32 (33) at the vibrating arm side becomes a tensile side, and the part 34 (35) at the opposite side of the part 32 (33) becomes a compressive side. Therefore, the temperature increases at the part 34 at the compressive side and the temperature decreases at the part 32 at the tensile side, so that heat transfers reversely, that is, from the part 34 at the compressive side through the part at the groove 30 to the part 32 at the tensile side.

In the first embodiment, a heat transfer path between the part 32 at the compressive side and the part 34 at the tensile side is narrowed at an intermediate part thereof by the groove 30. As a result, a relaxation time $\tau 1$ during which the temperature becomes an equilibrium condition between the parts 32 and 34 is longer than a relaxation time $\tau 0$ in a case of a related art structure having no groove. It can be considered that this is equivalent to a case where a width T of the connecting part 22 along a width direction of the vibrating arms is increased to a width T1 as shown by an imaginary line 22' in FIG. 2B, Accordingly, the piezoelectric vibration element 21 of the first embodiment has a relaxation vibration frequency f10 which is expressed as $f10=\frac{1}{2}\pi\tau 1$. Since $\tau 1 > \tau 0$ is satisfied, the relaxation vibration frequency f10 is lower than the relaxation vibration frequency f0, which is expressed as $f0=\frac{1}{2}\pi\tau 0$, of the related art structure.

Figure 5:
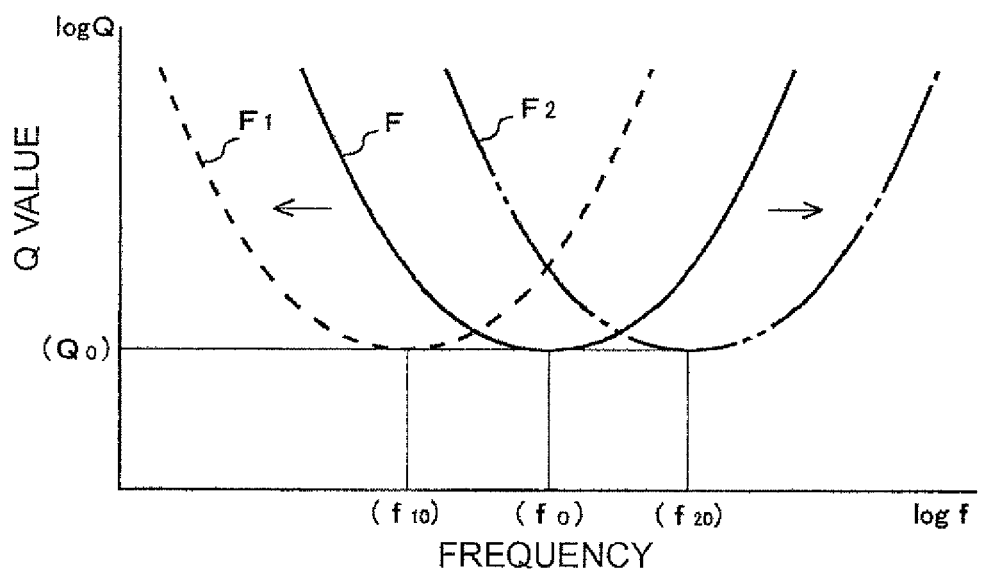
FIG. 5 is a diagram showing a relationship between relaxation frequency and a minimum value of a Q value of a piezoelectric vibration element in a flexural vibration mode.
Figure 6:
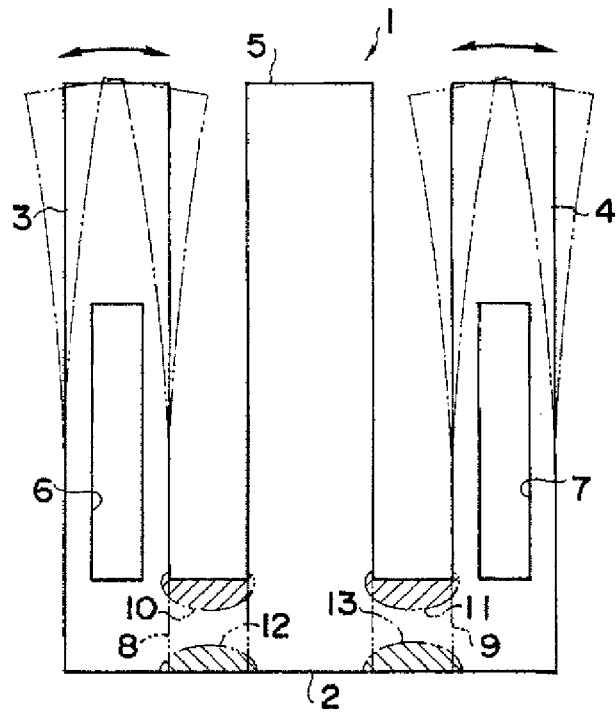
FIG. 6 is a plan view showing a typical example of a piezoelectric vibration element of a related art.

In view of the relationship between a frequency and a Q value in FIG. 5, a shape of a curve F is not changed, so that it can be considered that the curve F is shifted to a position of a curve F1, which is in a frequency lowering direction, with the lowering of the relaxation vibration frequency. Accordingly, when a desired using frequency is higher than the vibration frequency f0, the Q value is always higher than the minimum value Q0 of the related art structure. Thus, the provision of the grooves 30 and 31, having bottoms, on the connecting part 22 can improve the Q value and realize high performance of the piezoelectric vibration element 21 of the first embodiment. Further, a similar advantageous effect can be obtained in a case where the grooves having bottoms are provided only one of the front surface and the rear surface of the connecting part 22.

The inventor further studied a relationship between a width W of the grooves 30 and 31 and the width T of the connecting part 22. A shape of a section of the connecting part 22 in a longitudinal direction of the vibrating arms was set to be rectangular, the thickness of the part 22 was set to be 100 and the depths of the grooves 30 and 31 were respectively set to be 45. The Q value when the width W of the grooves was changed in a range from 0, that is, no groove as the related art, to 80 could be expressed by a quartic approximation by using a known finite element method. The result thereof is shown in FIG. 3.

Figure 3:
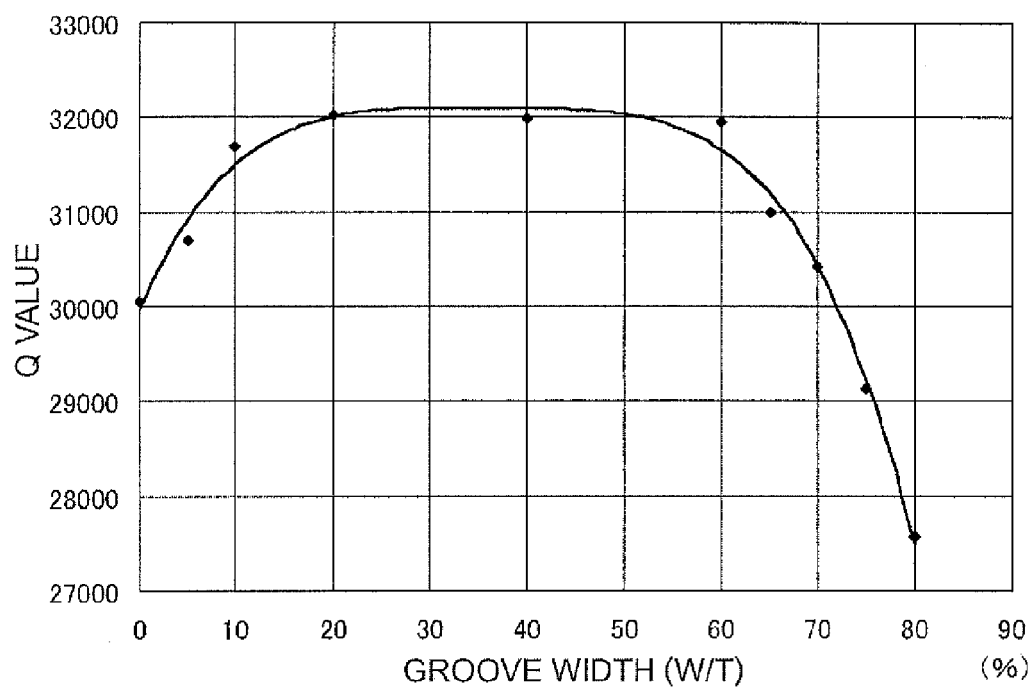
FIG. 3 is a diagram showing a relationship between a groove width (W/T) and a Q value of the piezoelectric vibration element of FIG. 1.

Referring to FIG. 3, the Q value relatively-sharply increases, is maintained nearly-constant, and then decreases relatively-sharply, due to the groove. From this diagram, it is found that the Q value increases about 5% or more when the width W of the groove with respect to the width T of the connecting part is in a range of $0.1\ T \leq W \leq 0.65\ T$. Further, when the width W of the groove is in a range of $0.2\ T \leq W \leq 0.6\ T$, the Q value increases about 7% or more. Thus, the Q value is substantially improved in the piezoelectric vibration element of the first embodiment by setting the width W of the grooves 30 and 31, compared to the related art.

In the first embodiment, a depth $D_1$ of the grooves provided on the front and rear surfaces of the connecting part is preferably set in a range of $0.1\ D_c \leq D_1 < 0.5\ D_c$ in which $D_c$ denotes the thickness of the connecting part, from a viewpoint of improvement of the Q value. When the depth $D_1$ of the groove is set to be in a range of $0.3\ D_c \leq D_1 < 0.5\ D_c$, the Q value can be further improved.

Second Embodiment

Figure 4A:
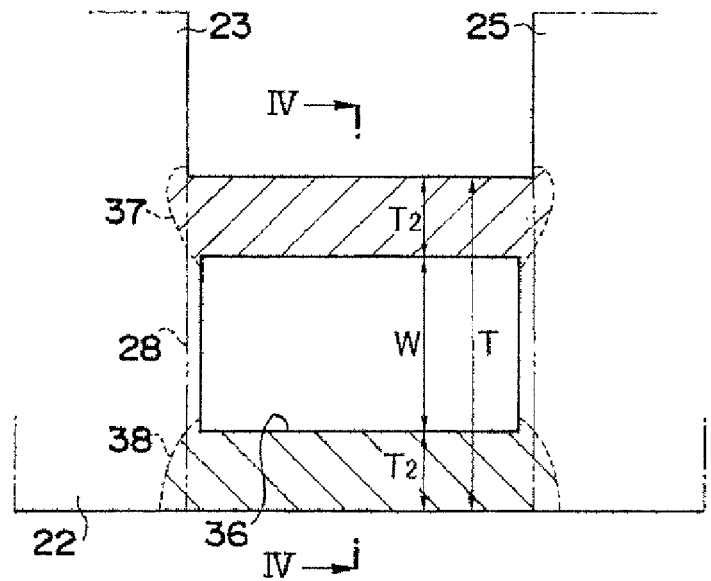
FIG. 4A is a partially-enlarged view showing a connecting part of a piezoelectric vibration element according to a second embodiment of the invention.
Figure 4B:
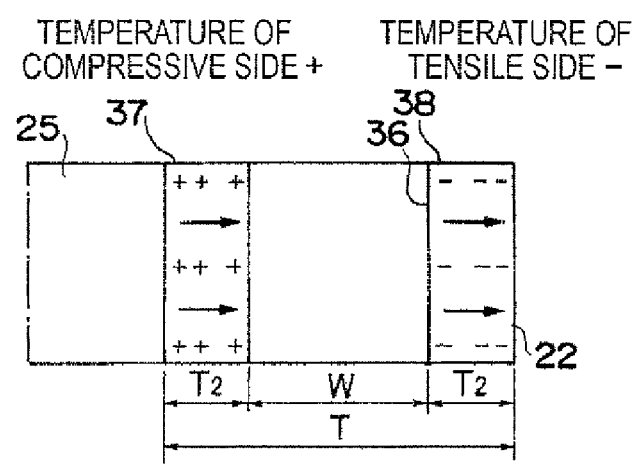
FIG. 4B is a sectional view taken along a IV-IV line of FIG. 4A.

FIGS. 4A and 4B are schematic views showing a structure of a piezoelectric vibration element, according to a second embodiment, to which the present invention is applied. The drawings show the same reference numerals for elements same as those of the first embodiment. In the second embodiment, grooves 36 are formed on the connecting part 22 along the width direction of the vibrating arms 23 and 24, concretely, formed in the region 28 between the connecting portion of the connecting part 22 with the vibrating arm 23 and the connecting portion of the same with the central supporting arm 25, and in the region 29 between the connecting portion of the connecting part 22 with the vibrating arm 24 and the connecting portion of the same with the central supporting arm 25. The grooves 36 penetrate the front and rear surfaces of the connecting part, which is different from the first embodiment (hereinafter, the groove 36 is also referred to as a through grove 36). Accordingly, a part 37 at a vibrating arm side, across the groove 36, along the longitudinal direction of the vibration arms is separated from a part 38 at an opposite side of the part 37 in each of the regions 28 and 29.

When the vibrating arms 23 and 24 horizontally perform flexural vibration in a direction closer to or away from each other as is the case with the first embodiment, compressive stress and tensile stress are generated in the region 28 between the connecting portion of the connecting part 22 with the vibrating arm 23 and the connecting portion of the same with the central supporting arm 25, and in the region 29 between the connecting portion of the connecting part 22 with the vibrating arm 24 and the connecting portion of the same with the central supporting arm 25 along the width direction of the vibrating arms. Concretely, when the vibrating arms 23 and 24 bend closer to each other, compressive stress acts on the part 37 at the vibrating arm side of each of the regions 28 and 29, and tensile stress acts on the part 38 opposed to the part 37. Accordingly, the temperature increases at the part 37 at the compressive side which receives the compressive stress, and the temperature decreases at the part 38 at the tensile side which receives the tensile stress. In an opposite manner, when the vibrating arms 23 and 24 bend away from each other, tensile stress acts on the part 37 at the vibrating arm side so as to decrease the temperature of the part 37 and compressive stress acts on the part 38 at the opposite side so as to increase the temperature of the part 38.

In the second embodiment, heat transfer does not occur between the part 37 at the vibrating arm side and the part 38 at the opposite side of the part 37 due to the through groove 36. However, in a local view, in the part 37 at the vibrating arm side of the connecting part, magnitude of the compressive stress or the tensile stress at the vibrating arm side is different from that at a groove 36 side. In a similar manner, in the part 38 at the opposite side of the part 37, magnitude of the compressive stress or the tensile stress at the groove 36 side is different from that at an opposite side of the groove 36 side. As a result, in each of the parts 37 and 38, temperature gradient between the vibrating arm side and the opposite side of the vibrating arm side is generated along a longitudinal direction of the vibrating arms. The gradient of the temperature is inverted depending on the bending direction, a direction coming closer to each other or a direction away from each other, of the vibrating arms.

FIG. 4B illustrates a case where the part 37 at the vibrating arm side becomes a compressive side and the part 38 at the opposite side of the part 37 becomes a tensile side when the vibrating arms bend in the direction coming closer to each other. In the drawing, a degree of temperature-increase is expressed by the number of symbols: +, and a degree of temperature-decrease is expressed by the number of symbols: −. Regarding the whole of the connecting part 22, the temperature increases at the part 37 at the compressive side and the temperature decreases at the part 38 at the tensile side. In a local view of the part 37, the temperature-increase is larger at the vibrating arm side at which the compressive stress is larger, and the temperature-increase is smaller at the groove 36 side at which the compressive stress is smaller. In the inside of the part 37, temperature gradient from the vibrating arm side (++) to the groove 36 side (+) is generated due to the relative difference between the temperature-increases, and heat transfer occurs along the temperature gradient.

In the same manner, in a local view of the part 38, the temperature-decrease is larger at the opposite side, at which the tensile stress is larger, of the vibrating arm side, and the temperature-decrease is smaller at the groove 36 side at which the tensile stress is smaller. In the inside of the part 38, temperature gradient from the groove 36 side (−) to the opposite side (−−) of the groove 36 side is generated due to the relative difference between the temperature-decreases, and heat transfer occurs along the temperature gradient.

In an opposite manner, when the vibrating arms bend away from each other, the part 37 at the vibrating arm side becomes a tensile side, and the part 38 at the opposite side of the part 37 becomes a compressive side. Accordingly, regarding the whole of the connecting part 22, the temperature decreases at the part 37 at the tensile side and the temperature increases at the part 38 at the compressive side. In a local view of each of the parts 37 and 38, temperature gradients are respectively generated in the part 38 from the opposite side of the vibrating arm side to the groove 36 side, and in the part 37 from the groove 36 side to the vibrating arm side. Accordingly, heat transfer occurs in the parts 37 and 38 along the temperature gradients.

In the second embodiment, a heat transfer path inside each of the parts 37 and 38 is substantially shorter than that of the related art due to the groove 36. As a result, a relaxation time τ2 during which the temperature becomes an equilibrium condition in each of the parts 37 and 38 is shorter than a relaxation time τ0 in a case of a related art structure having no groove. It can be considered that this is equivalent to a case where the width T of the connecting part 22 is decreased to a width T2 of each of the parts 37 and 38 along the width direction of the vibrating arms. Accordingly, the piezoelectric vibration element of the second modification has a relaxation vibration frequency f20 which is expressed as f20=½πτ2. Since τ2<τ0 is satisfied, the relaxation vibration frequency f20 is higher than the relaxation vibration frequency f0, which is expressed as f0=½πτ0, of a related art structure.

In view of the relationship between a frequency and a Q value in FIG. 5, the shape of the curve F is not changed, so that it can be considered that the curve F is shifted to a position of a curve F2, which is in a frequency rising direction, with the rise of the relaxation vibration frequency. Accordingly, when a desired using frequency is lower than the vibration frequency f0, the Q value is always higher than the minimum value Q0 of a related art structure. In the second embodiment as well, the Q value can be improved by providing the through grooves 36 on the connecting part 22, realizing high performance of the piezoelectric vibration element as is the case with the first embodiment.

The invention is not limited to the above embodiments but may be embodied by adding various kinds of modifications and alterations without departing from the technical scope of the invention. For example, the present invention is applicable to a piezoelectric vibration element in which three or more vibrating arms extend from a connecting part. Further, a flexural vibration element of the above embodiments is formed in one body with the piezoelectric material, but may be formed by providing a piezoelectric plate material on a surface of a silicon semiconductor or the like. Further, the present invention is applicable not only to a flexural vibration element of a piezoelectric driving type but also to that of an electrostatic driving type or a magnetic driving type. In this case, the flexural vibration element may be made of a known material such as silicon semiconductor as well as the piezoelectric material. Further, the flexural vibration element of the invention is applicable to various electronic components as well as the piezoelectric device.

What is claimed is:

1. A flexural vibration element, comprising:
  a plurality of vibrating arms provided in parallel with each other;
  a connecting part connecting the vibrating arms; and
  one central supporting arm extending between the vibrating arms from the connecting part in parallel with the arms at equal distance from the arms,
  wherein the connecting part has a groove having a bottom formed in each of front and rear surfaces thereof in a width direction of the vibrating arms,
  a depth of D1 of the grooves is set in a range of 0.1 Dc<D1<0.5 Dc,
  wherein Dc is the thickness of the connecting part,
  the groove being provided between one of the plurality of vibrating arms and the central supporting arm, and being positioned in an area of the connecting part in which compressive stress and tensile stress due to flexural vibration of the vibrating arms alternately occur at a vibrating arm side and an opposite side of the vibrating arm side.

2. The flexural vibration element according to claim 1, wherein a width W of the groove, in a longitudinal direction of the vibrating arms, with respect to a width T of the connecting part is in a range of $0.1\ T \leqq W \leqq 0.65\ T$.

3. The flexural vibration element according to claim 2, wherein the width W of the groove, in the longitudinal direction of the vibrating arms, with respect to the width T of the connecting part is in a range of $0.2\ T \leqq W \leqq 0.6\ T$.

4. The flexural vibration element according to claim 1, wherein the vibrating arms, the connecting part, and the central supporting arm are made of quartz crystal and formed in an integrated manner.

5. An electronic component, comprising:
the flexural vibration element according to claim 1.

6. The flexural vibration element according to claim 1, wherein the groove of the connecting part is formed only in a portion of the connecting part between the one of the plurality of vibrating arms and the central supporting arm.

7. The flexural vibration element according to claim 1, the connecting part having a second groove form on both a front and rear surface thereof in a width direction of the vibrating arms, the second groove being provided between a second vibrating arm of the plurality of vibrating arms and the central supporting arm.

8. The flexural vibration element according to claim 1, the second groove being provided only between the second vibrating arm and the central supporting arm.

* * * * *